United States Patent [19]

Jordan

[11] 3,747,202

[45] July 24, 1973

[54] METHOD OF MAKING BEAM LEADS ON SUBSTRATES

[75] Inventor: John Robert Jordan, Phoenix, Ariz.

[73] Assignee: Honeywell Informations Systems, Inc., Waltham, Mass.

[22] Filed: Nov. 22, 1971

[21] Appl. No.: 200,873

[52] U.S. Cl. ........................ 29/577, 29/578, 29/580, 29/589

[51] Int. Cl. ........................ B01j 17/00

[58] Field of Search ........................ 29/578, 580, 577, 29/589

[56] References Cited

UNITED STATES PATENTS

| | | | |
|---|---|---|---|
| 3,550,261 | 12/1970 | Schroeder | 29/589 |
| 3,590,478 | 7/1971 | Takehana | 29/578 |
| 3,699,010 | 10/1972 | Nash | 29/580 |
| 3,690,966 | 9/1972 | Hayashi et al. | 29/578 |

*Primary Examiner*—Charles W. Lanham
*Assistant Examiner*—W. C. Tupman
*Attorney*—Edward W. Hughes et al.

[57] ABSTRACT

A method of forming beam leads on substrates by depositing a thin film of metal over an adherent layer of conductive material on the substrate, and electrodepositing additional metal over the thin film in a predetermined pattern defining the leads. The unprotected thin film and adherent layer are dissolved and the remaining adherent layer is selectively etched from beneath portions of the electrodeposited leads. The substrate is then separated beneath the nonadhering lead portions.

12 Claims, 6 Drawing Figures

INVENTOR.
JOHN R. JORDAN

BY Edward A. Gerlaugh

AGENT

INVENTOR.
JOHN R. JORDAN

BY Edward A. Gerlaugh

AGENT

METHOD OF MAKING BEAM LEADS ON SUBSTRATES

BACKGROUND OF THE INVENTION

1. Field of the Invention

This invention relates to the fabrication of integrated circuit assemblies and more particularly to the forming of both flexible and relatively solid leads between the contact areas on chips and conductors on a substrate.

2. Description of the Prior Art

In the packaging and interconnection of integrated circuit chips, it has been common to utilize so-called fly-wire leads to connect the electrically active regions from contact lands or pads on a chip or die to external circuits. The connection of fly-wire leads is largely a manual operation; considerable time and effort is required for making the bonds required by such leads. In addition, it has been found that fly-wire leads do not lend themselves to the production of multiple chip assemblies.

Methods have also been developed for forming relatively heavy self-supporting leads, or beam leads, which adhere to the electrically active regions of a semiconductor device. Beam leads are small ribbon-like structures generally of gold, formed directly on the chips and protruding beyond the edges of the chips.

The fabrication of beam leads is a batch process using well known photolithographic techniques whereby the leads are produced on a wafer having a plurality of integrated circuit chips. Subsequent to the fabrication of the beam leads, the multi-chip assembly or wafer is divided into individual devices by masking the back side of the substrate material and subjecting it to an etchant which dissolves the substrate material surrounding the electrically active regions of each device. Portions of the wafer are thus removed to define individual devices of semiconductor material, each containing the electrically active elements of a device with portions of the beam leads adhering to a surface of the device and other portions extending outwardly from the body. The portions of the beam leads extending outwardly beyond the edge of the substrate material may be directly connected as by welding or reflow soldering or the like, to the leads of a package, or to contact areas of a circuit array on another substrate.

In each of the several techniques for fabricating beam leads, the substrate itself or material filled into a fenestrated substrate, must be etched away from the back side of the substrate, i.e., from beneath the beam leads.

SUMMARY OF THE INVENTION

The present invention alleviates the above-mentioned problems by providing an improved batch process for forming leads electrically connecting the active regions of an integrated circuit chip to a circuit array or leads on a substrate, and for forming leads on a substrate for joining to relatively massive external circuit interconnecting elements.

In accordance with one aspect of the invention, a semiconductor device is provided with a set of rigid or flexible contact fingers for connection to a circuit array on a substrate. The semiconductor device may be either bonded to the substrate to provide good thermal contact between the device and the substrate, or the device may be mounted face down in the well known flip-chip configuration.

In accordance with another embodiment of this invention, a semiconductor device having contact lands or pads is electrically connected to a circuit array on a substrate by a set of flexible contact leads formed as part of the array. Additionally, other leads of the array projecting outwardly from the substrate may be connected to relatively massive external circuit interconnecting elements.

For the production of the devices described above, the present invention provides an improved method of forming connecting leads on a substrate. A surface of the substrate is coated with an adhesive or adherent thin-film layer of metal. A thin film of conductive material is then deposited over the entire surface of the adherent layer. Next, a patterned layer of nonconductive masking material, commonly termed "resist" or "photoresist," is deposited on the thin film of conductive material in accordance with known screening or photolithographic masking techniques. Additional conductive material is then electrodeposited onto the areas remaining uncovered or exposed after deposition of the masking material, thereby forming the leads. The nonconductive masking material is then removed and the exposed thin-film layer of conductive material and the underlying adherent layer are etched away. Another patterned layer of masking material is then deposited on the surface of the assembly, to cover only portions of the leads, the exposed areas of the pattern defining lead portions to be undercut and separated from the substrate by removing the underlying adherent layer. The assembly is then subjected to an etchant capable of dissolving the adherent layer but not the conductive material forming the leads. Selected portions of the leads are thus undercut, separating those portions from the substrate, the other portions of the leads remaining securely attached to the substrate by the undissolved adherent layer.

After formation of the connecting leads, the substrate may be divided into individual devices by appropriately scribing and breaking, sawing, or otherwise cutting or separating the substrate, whereby the separated lead portions extend outwardly from the edge of the substrate.

BRIEF DESCRIPTION OF THE DRAWINGS

The foregoing and other objects and features of my invention will become more apparent and the invention itself will be best understood by referring to the following description and embodiments taken in conjunction with the accompanying drawings, in which.

Figure 1:
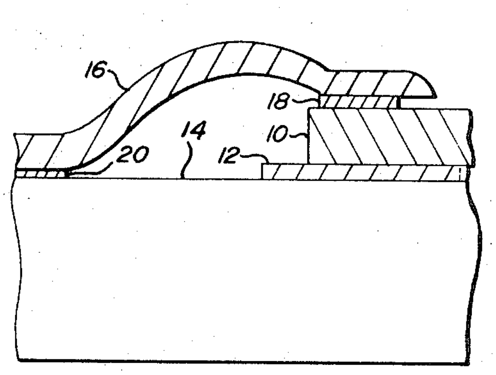
FIG. 1 is an enlarged diagrammatic cross section of a substrate having a semiconductor chip mounted thereon and leads joined to corresponding contact pads on the chip.

Because of the extreme small size of various portions of the elements shown in the drawings the dimensions of some of the elements have been exaggerated with respect to the other elements. It is believed that greater clarity of presentation is thereby obtained despite the resultant distortion of elements in relation to their actual physical appearance.

DETAILED DESCRIPTION OF THE INVENTION

In one exemplary embodiment of a device produced in accordance with the present invention, there is shown in FIG. 1 a portion of a semiconductor device 10 comprising a portion of a chip or die attached to a die-bonding pad 12 on a substrate 14. The substrate 14 may be of any suitable material as for example alumina, glass, quartz, silicon, polyimide plastic, epoxy glass, or the like. A lead 16 formed on the substrate 14, in accordance with the present invention, is shown bonded to a conductive land or pad 18 on the semiconductor device or chip 10. A portion of the connecting lead 16 is shown attached to the substrate 14 by an intervening layer of adherent material 20.

Figure 2:
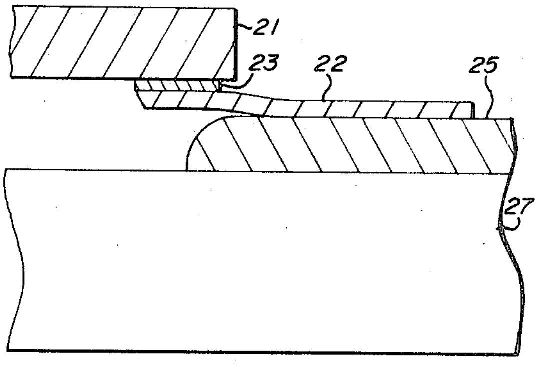
FIG. 2 similarly illustrates the flip-chip embodiment wherein the chip is supported by the leads.

FIG. 2 illustrates an alternate embodiment wherein a portion of a semiconductor device 21 is shown mounted in a face-down position, the well known flip-chip arrangement. One of a plurality of connecting leads 22 shown is formed directly on the device 21 by the process of the present invention and is attached to the body of the semiconductor device 21 by an intervening layer of adherent material 23. In the flip-chip configuration, the portions of the leads 22 extending outwardly from the body of the semiconductor device 21 are each electrically connected as by thermocompression bonding, solder reflow or the like to a corresponding one of a plurality of leads 25 forming a circuit array (e.g., printed circuits) on a substrate 27. The substrate may be of any suitable material as previously described for FIG. 1.

Figures 3, 4:
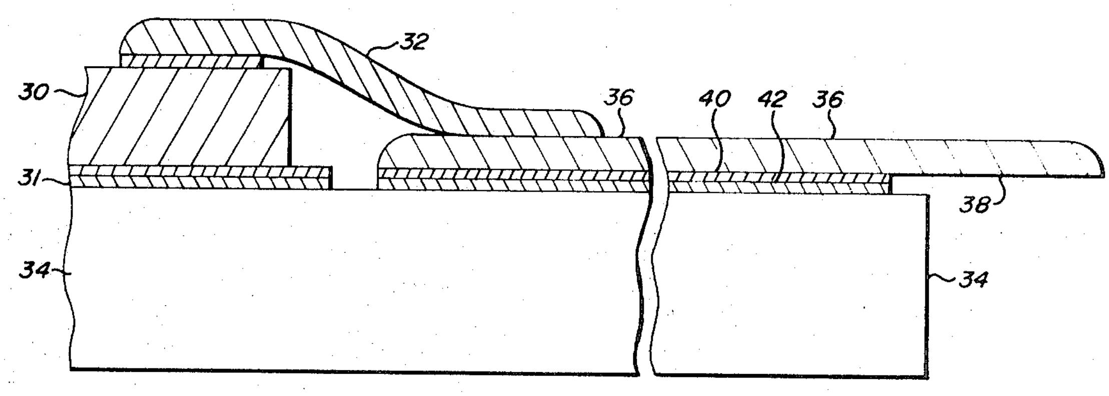
FIGS. 3 and 4 show enlarged diagrammatic cross sections respectively of a semiconductor chip and a substrate having leads formed thereon in accordance with my invention.

FIG. 3 shows a portion of a semiconductor chip 30 with one of a plurality of connecting leads 32 formed on the active surface of the chip 30 in accordance with the present invention. The back side of the semiconductor device 30 is bonded to a pad 31 on the substrate 34. The portion of each of the leads 32 extending outwardly from the edge of the semiconductor chip 30 may be connected, as by welding, reflow soldering, or the like, to a corresponding lead 36 forming a part of the conductor array on the substrate 34. The substrate 34 may be of any suitable material as previously described.

FIG. 4 represents an extension of the substrate 34 and lead 36 illustrated in FIG. 3. The lead 36 is attached to the substrate by the process of the present invention. An intervening layer 40 of conductive material of the same or similar material utilized to form the lead 36 is shown overlying a thin-film layer of adherent material 42 between the layer 40 and the substrate 34. A portion of the lead 36 extends outwardly beyond the edge of the substrate 34. The outwardly extending portion 38 of the lead 36, one of a plurality of such leads in an array on the substrate 34, may be utilized for connecting the array to an external circuit interconnecting system (not shown), which system is relatively massive in relation to the leads 36 forming the circuit array on the substrate 34.

The semiconductor devices 10, 21 and 30, shown respectively in FIGS. 1, 2 and 3 may be portions of monolithic integrated circuits; however, the present invention may also be used on a variety of discrete semiconductor devices such as bipolar and unipolar transistors, diodes, and the like. The present invention is not concerned with the production of the device itself. The manufacture of the devices 10, 21 and 30 will not be disclosed as it is well known to those skilled in the art. The present invention insofar as the semiconductor devices are concerned has been described hereinbefore in terms of a portion of a single semiconductor chip.

During the manufacture of semiconductor devices, a chip forms only a small portion of a semiconductor wafer. A wafer, ordinarily comprised of a plurality of undivided chips or dice, may also be termed a substrate. It will be understood that the procedures to be described may be accomplished on either an entire wafer or a substrate, as for example the substrates 14, 27 and 34, respectively, of FIGS. 1, 2 and 3.

Figure 5:
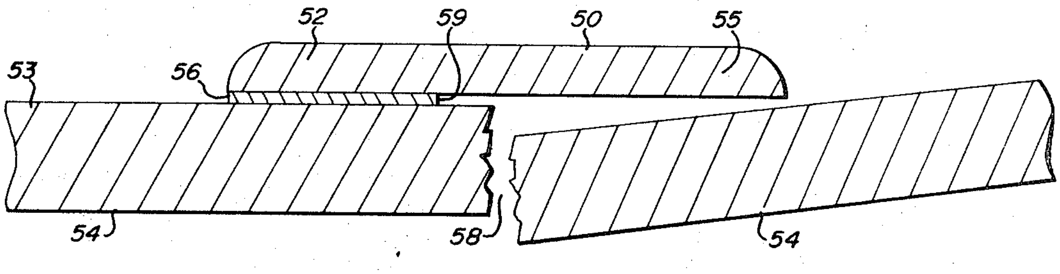
FIG. 5 illustrates the manner in which a substrate may be separated to form protruding leads.

FIG. 5 illustrates the manner in which a lead 50 is formed in accordance with the present invention, having a portion 52 thereof attached to an active surface 53 of a substrate 54 by an intervening layer of adherent material 56. The layer of adherent material 56 does not underlay the other portion 55 of the lead 50, the adherent layer having been previously etched away from beneath the other lead portion 55. After the adherent material is etched away from beneath the lead portion 55, the substrate 54 is separated as by scribing and breaking, sawing, cutting or the like. The separation is effected in a region 58 near, but not directly adjacent, the attached portion 52, so as to prevent the lead 50 separating from the substrate at the edge 59 of the attached area.

In the preferred embodiment of the present invention, leads are formed on a substrate using molybdenum and gold films in combination. The nature of the molybdenum-gold combination provides leads having superior electrical and mechanical characteristics when compared with leads formed of other metal film combinations. Molybdenum makes good electrical contact with silicon semiconductor material and adheres well to the gold as well as to substrate surfaces such as silicon, germanium, quartz, alumina, beryllia, glass, epoxy glass, polyimide plastic or the like. Molybdenum thus forms the most desired adherent layer. Molybdenum can be etched in a highly controlled manner with an etchant compatibe with the other materials, i.e., gold is relatively impervious to the molybdenum etchant.

Although molybdenum is the preferred adherent material in the present invention, other metals such as chromium, nickel, nickel-chromium, nickel-iron, and titanium may be used. Similarly, conductive material other than gold may be used to form the leads, as for example, platinum, silver, copper, and aluminum. Some metal film combinations other than molybdenum-gold, however, tend to interdiffuse or form alloys thereby degrading the adhesion of the layer of adherent material. The molybdenum-gold combination forms a contact system which is virtually alloyless and not subject to loss of adhesion and increased electrical resistivity caused by the interdiffusion associated with other metal film combinations.

Gold is the preferred conductor utilized to form the leads of the present invention. In addition to its excellent conductivity, gold is easily deposited by conventional sputtering, vacuum evaporation, and electrodeposition techniques, and lends itself well to photoresist etching processes for defining the leads or lead arrays.

The preferred molybdenum-gold combination is more reliable than other metal film combinations in high current density applications. The phenomenon of conductor degradation caused by unidirectional election flow resulting in conductor atom and ion migration has been termed electromigration or current-induced mass transport. The rate of conductor degradation is lower for metals having relatively high values of activation energy of self diffusion. Gold and particularly molybdenum have very high values of activation energy of self diffusion when compared with most other conductors and adherent materials previously named, and thus are minimally susceptible to electrodiffusion problems.

Figure 6:
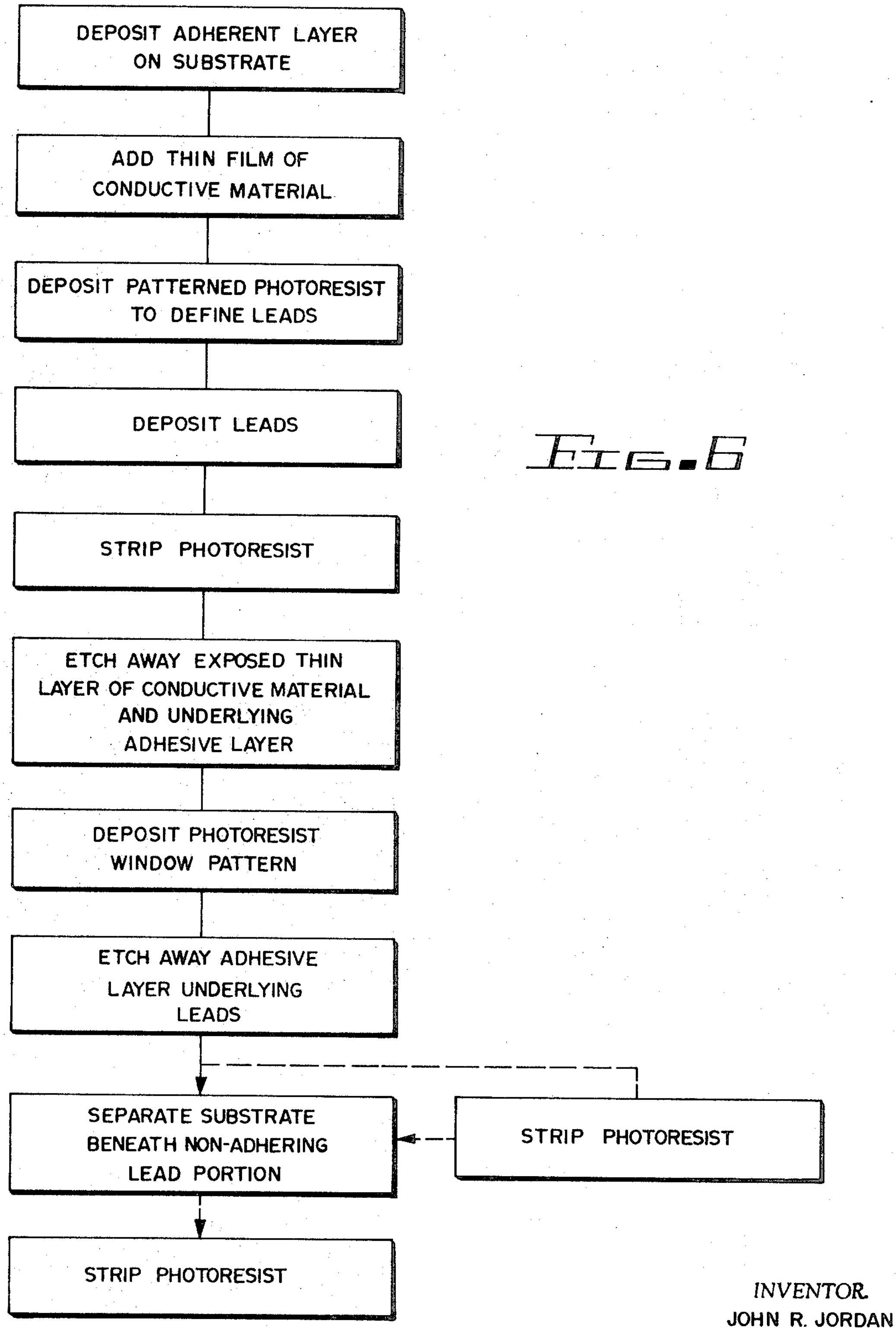
FIG. 6 is a flow chart of the method of producing leads in accordance with my invention.

Referring now to FIG. 6, the method of forming the leads illustrated in FIGS. 1 through 5 will now be described. A suitable substrate is thoroughly cleaned and dried and coated with a thin film of adherent material, preferably molybdenum, having a thickness of 100 to 3,000 angstroms. The adherent layer may be deposited by various techniques well known in the art, as by sputtering or vacuum evaporation.

A thin film of conductive material, preferably gold, is then deposited over the layer of adherent material. The gold film, which may be deosited in a like manner as the adherent layer to a thickness of 1,000 to 5,000 angstroms, provides a conductive layer for the subsequent electrodeposition of the leads.

The perimeters of the leads to be deposited are then defined using conventional photolithographic masking techniques well known in the industry. A layer of photosensitive resist or photoresist material is applied over the thin film of conductive material as by spinning, dipping, or spraying. The layer of resist is dried and then selectively exposed to ultraviolet light through a patterned mask. The resist is then developed to remove the unwanted portions, dried and baked. The remaining resist provides a nonconductive patterned mask overlying the thin film of gold, and if desired, the underside and edges of the wafer or substrate. Alternatively, a patterned layer of resist may also be applied by silk screening techniques.

A cathode connection is made through the layer of resist to the underlying layer of conductive material. The substrate is then immersed in a plating solution. The leads are thus formed by electrodeposition of a conductive material preferably of the same or similar material as the previously deposited thin film of conductive material, e.g., gold in the preferred embodiment. The gold leads may be plated having widths, as for example, from 1 to 5 mils, with corresponding thicknesses of several microns to several mils. Leads having widths greater than 5 mils and correspondingly greater thicknesses may also be deposited.

Following the electrodeposition of the gold leads and suitable rinsing of the assembly, the photoresist is stripped or removed by dissolving in an appropriate solvent. The assembly is then subjected to a spray etchant comprised of three parts by weight of potassium iodide, one part by weight of iodine, and 15 parts by weight of water. This etchant dissolves gold at a rate of about 200 angstroms per second, consequently the substrate is spray etched from 5 to 25 seconds in order to completely dissolve the thin film of gold which does not underly the electrodeposited gold leads. The plated gold leads will also be etched during this step, but only a small fraction of their total thickness will be removed. After rinsing and drying the assembly, the exposed adherent layer of molybdenum is etched in a solution of one part by weight of sodium hydroxide, two parts by weight of potassium ferricyanide, 20 parts by weight of water, and 140 parts or more by weight of glycerol. This etchant, due to the viscosity imparted by the glycerol, will dissolve the exposed adherent layer of molybdenum without undercutting the leads. Immediately after removal from the etchant, the assembly is thoroughly rinsed and cleaned as by ultrasonic cleaning in a mild detergent solution, and again thoroughly rinsed with water and dried in air.

During the previously described steps of depositing the patterned resist to define the leads, and electrodepositing the leads themselves, the resist may also be patterned to define the die-bonding pad 12 of FIG. 1. Referring briefly to FIG. 1, it may be seen that the lead 16 was deposited during the same step as the die-bonding pad 12, as indicated by the dashed line shown in the bonding pad 12. The dashed line shows the position of the end of the lead 16 prior to lifting the lead 16 from the substrate 14. It is to be understood that the adherent layer 20 of FIG. 1 also underlies the die-bonding pad 12 of FIG. 1, but is omitted from the illustration for clarity. Further, the pad must be of sufficient thickness, say, greater than 2 microns, to perform its intended function without completely diffusing into the semiconductor material. The die-bonding pad 31 of FIG. 3 shows both the adherent layer and the thin film of conductive material.

Returning now to FIG. 6, after etching away the exposed thin film of conductive material and the underlying adherent layer, a second layer of resist is deposited as previously described over the assembly. The resist is patterned to define window areas where the adherent layer underlying the leads is to be etched away. The assembly is again immersed in an etchant solution comprised of one part by weight of sodium hydroxide, two parts by weight of potassium ferricyanide, and 20 parts by weight of water. The etchant dissolves molybdenum but does not attack gold, and therefore, only the molybdenum underlying the unmasked portions of the gold leads is dissolved. Immersion time varies, depending on lead width and the thickness of the underlying adherent layer of molybdenum. Approximately one minute is required to etch a 150 angstrom thick layer of molybdenum from beneath a 4 mil wide lead. The assembly is cleaned and dried immediately upon removal from the etchant as previously described.

After completion of the steps of forming the leads according to the method of the invention, the wafer or substrate is divided into individual devices or groups of devices. It was found that leaving the window-patterned resist on the substrate during the separation step was advantageous in certain operations as for example (FIG. 1) when the lead 16 was lifted from the surface of the substrate 14. In the case where thicker leads were deposited (greater than 10 microns) and the resist was stripped prior to bending the leads, the leads would sometimes tear loose from the substrate before bending, even though the gold-molybdenum bond to the substrate was sufficiently strong to fracture and tear out small strips of the substrate.

Either before or after stripping the window-patterned photoresist from the assembly, the wafer or substrate may be separated beneath the non-adhering lead portions as previously described with reference to FIG. 5. The wafer or substrate may be scribed or otherwise cut on the side opposite the leads, and fractured leaving the leads extending beyond the substrate edge. Other methods such as sawing or cutting, again from the side opposite the leads, as for example with a circular saw, a laser beam, or an air knife having an abrasive mixture added to the air stream, may be utilized prior to fracturing the wafer or substrate during the separation step.

It is to be understood that throughout the above description the use of the preferred metals, molybdenum and gold, include not only pure metals, but also molybdenum and gold having minor percentages of impurities added in order to gain specific advantages. For example, trace impurities may be added to the adherent layer of molybdenum to increase its adherence. A slight percentage of platinum may be added to the thin film of gold to increase the adhesion of the gold to the molybdenum. Larger percentages of impurities such as copper may be added to the electrodeposited gold to increase its hardness.

From the foregoing detailed description, it will be appreciated that the previously stated objects and advantages, as well as others apparent from the specification, have been achieved by the embodiments described herein.

Obviously, many modifications and variations of my invention are possible in the light of the above teachings. It is therefore understood that my invention may be practiced otherwise than as specifically described and it is intended by the appended claims to cover all such modifications of the invention which fall within the true spirit and scope of the invention.

I claim:

1. An improved batch process of the type utilizing photolithographic techniques for forming conductors on a substrate having a plurality of electronic circuits on an active surface of said substrate, said process forming leads for connecting said circuits to other circuits, each of said leads having a part attached to one of said electronic circuits and another part projecting from said substrate, said process comprising the steps of:

- depositing on the active surface of said substrate an adherent layer of conductive material;
- depositing a thin film of conductor metal over said deposited adherent layer;
- depositing a first patterned layer of resist over the thin film of conductor metal, the pattern defining the limits of the leads;
- electrodepositing conductor metal on said areas to form said leads;
- stripping the photoresist to expose the thin film of conductor metal;
- etching away the exposed thin film of conductor metal;
- etching away the adherent layer of conductive material exposed in the previous etching step and unprotected by the electrodeposited conductor metal;
- depositing a second patterned layer of resist, the pattern defining said other lead parts where the underlying adherent layer is to be removed;
- etching away said adherent layer underlying said exposed lead portions in said window areas to form non-adhering lead portions; and
- separating said substrate into parts along lines beneath said non-adhering lead portions.

2. The process of claim 1 wherein the substrate is a wafer of semiconductor material.

3. The process of claim 1 wherein the deposited adherent layer is a thin film of metal having a thickness of 100 to 1,000 angstroms.

4. The process of claim 1 wherein the conductor metal is gold.

5. The process of claim 1 wherein the adherent layer is a thin film of molybdenum having a thickenss of 100 to 3,000 angstroms, and the conductor metal is gold.

6. The process of claim 1 wherein the step of etching away the exposed adherent layer utilizes an etchant solution comprising 50 to 95 percent by weight of glycerol.

7. An improved batch process of the type utilizing photolithographic techniques for defining conductors on an active surface of a substrate, said process forming leads on the substrate, each of the leads having a part attached to the active surface and another part projecting from the active surface, said process comprising the steps of:

- depositing on the active surface of the substrate a thin film of molybdenum;
- depositing a thin film of gold over the thin film of molybdenum;
- depositing a thin layer of photoresist over the thin film of gold and developing said deposited layer of photoresist in a predetermined pattern to expose portions of said thin film of gold, the exposed portions defining areas on which the leads are to be formed;
- electrodepositing gold to form the leads;
- stripping the photoresist to expose the thin film of gold;
- etching away the exposed thin film of gold;
- etching away the thin film of molybdenum exposed during the preceding etching step;
- depositing a layer of resist over the assembly and developing said layer of resist in a predetermined window pattern to expose portions of said electrodeposited leads, the exposed portions defining window areas for undercutting said lead portions;
- etching away the molybdenum underlying the other lead parts defined by the patterned layer of resist; and
- separating the substrate into parts along a line beneath selected ones of the other lead parts separated from the substrate in the preceding etching step.

8. The process of claim 5 or claim 7 wherein the step of etching away the thin film of molybdenum utilizes an etchant solution consisting essentially of aqueous potassium ferricyanide, aqueous sodium hydroxide and glycerol.

9. The process of claim 8 wherein the glycerol component comprises 50 to 95 percent by weight of the etchant solution.

10. The process of claim 7 further including the step of stripping the layer of resist after the step of etching away the molybdenum underlying the other lead parts.

11. The process of claim 7 further including the additional steps of:

- lifting other ones of the separated lead parts;
- positioning an integrated circuit chip on the substrate beneath the lifted lead parts; and
- bonding the lifted lead parts to the integrated circuit chip.

12. The process of claim 7 wherein the substrate is a wafer of semiconductor material.

* * * * *